United States Patent
Gong et al.

(10) Patent No.: US 11,515,803 B2
(45) Date of Patent: Nov. 29, 2022

(54) ISOLATED POWER CONVERTER AND HYDROGEN PRODUCTION SYSTEM

(71) Applicant: SUNGROW POWER SUPPLY CO., LTD., Anhui (CN)

(72) Inventors: Shengwei Gong, Anhui (CN); Tengfei Wang, Anhui (CN); Xiaolei Shi, Anhui (CN); Gaozhou Tao, Anhui (CN)

(73) Assignee: SUNGROW POWER SUPPLY CO., LTD., Anhui (CN)

( * ) Notice: Subject to any disclaimer, the term of this patent is extended or adjusted under 35 U.S.C. 154(b) by 57 days.

(21) Appl. No.: 17/134,443

(22) Filed: Dec. 27, 2020

(65) Prior Publication Data

US 2021/0351715 A1 Nov. 11, 2021

(30) Foreign Application Priority Data

May 6, 2020 (CN) .......................... 202010372553.5

(51) Int. Cl.
*H02M 7/00* (2006.01)
*C01B 3/32* (2006.01)
(Continued)

(52) U.S. Cl.
CPC .............. *H02M 7/003* (2013.01); *C01B 3/32* (2013.01); *H01H 9/0044* (2013.01); *H02M 7/21* (2013.01);
(Continued)

(58) Field of Classification Search
CPC ............ H02M 7/003; H02M 7/21; C01B 3/32
See application file for complete search history.

(56) References Cited

U.S. PATENT DOCUMENTS

2006/0152085 A1\* 7/2006 Flett ...................... H02M 7/003
307/75
2010/0302733 A1 12/2010 Woody et al.
2019/0193581 A1\* 6/2019 Beulich ................... B60K 6/28

FOREIGN PATENT DOCUMENTS

CN 102545630 A 7/2012
CN 103915738 A 7/2014
(Continued)

OTHER PUBLICATIONS

Extended European Search Report regarding Application No. 20217427.2 dated Jun. 9, 2021.
(Continued)

*Primary Examiner* — Adolf D Berhane
*Assistant Examiner* — Afework S Demisse
(74) *Attorney, Agent, or Firm* — Harness, Dickey & Pierce, P.L.C.

(57) ABSTRACT

An isolated power converter and a hydrogen production system are provided. An electrical connection structure in the isolated power converter includes N secondary winding output bus bars, N rectifier circuit input bus bars, and a positive-negative bus bar, where N is greater than or equal to 1. A secondary winding may include M tapping points, and the secondary winding output bus bar and the rectifier circuit input bus bar that correspond to the secondary winding each include M copper bars that are insulated and stacked. The M tapping points of the secondary winding overlap the M copper bars of the secondary winding output bus bar at input ends of the M copper bars, respectively. The positive-negative bus bar includes two copper bars that are insulated and stacked.

12 Claims, 7 Drawing Sheets

(51) Int. Cl.
*H01H 9/00* (2006.01)
*H02M 7/21* (2006.01)
*H05K 7/20* (2006.01)

(52) U.S. Cl.
CPC ......... *H05K 7/209* (2013.01); *H05K 7/20927* (2013.01)

(56) References Cited

FOREIGN PATENT DOCUMENTS

| | | |
|---|---|---|
| CN | 105551772 A | 5/2016 |
| CN | 106487242 A | 3/2017 |
| CN | 207098929 U | 3/2018 |
| CN | 210007609 U | 1/2020 |
| CN | 210201727 U | 3/2020 |
| WO | WO-2013092063 A1 | 6/2013 |

OTHER PUBLICATIONS

Tan, Nadia Mei Lin, et. al., "Design and Performance of a Bidirectional Isolated DC-DC Converter for a Battery Energy Storage System," IEEE Transactions on Power Electronics, vol. 27, No. 3; Mar. 2012, pp. 1237-1248.

Wang, Dan et al., "A 10-kV/400-V 500-kVA Electronic Power Transformer," IEEE Transactions on Industrial Electronics, vol. 63, No. 11; Nov. 2016, pp. 6653-6663.

Agrawal, K.C., "Recommended Practices for Mounting Buses and Making Bus Joints," Electrical Power Engineering Reference & Applications Handbook, Jan. 2017, pp. 1039-1048.

First Chinese Office Action regarding Application No. 202010372553.5 dated Dec. 28, 2020. English translation provided by Unitalen Attorneys at Law.

European Office Action regarding Application No. 20217427.2 dated Oct. 7, 2022.

\* cited by examiner

ISOLATED POWER CONVERTER AND HYDROGEN PRODUCTION SYSTEM

The present application claims priority to Chinese Patent Application No. 202010372553.5, titled "ISOLATED POWER CONVERTER AND HYDROGEN PRODUCTION SYSTEM", filed on May 6, 2020 with the China National Intellectual Property Administration, which is incorporated herein by reference in its entirety.

TECHNICAL FIELD

The present disclosure relates to the field of electrical technology, and in particular to an isolated power converter and a hydrogen production system.

BACKGROUND

FIG. 1 shows a circuit diagram of an isolated power converter. The isolated power converter includes a high-frequency transformer, a rectifier circuit, and an output capacitor. The high-frequency transformer includes N (where N is greater than or equal to 1, and FIG. 1 shows an example in which N is equal to 2) secondary windings. Each of the N secondary windings is cascaded to an input end of one rectifier circuit and output ends of the N rectifier circuits are connected in parallel to the output capacitor.

According to the conventional technology, the high-frequency transformer is electrically connected to the rectifier circuit via bare copper bars. However, there is a large gap between bare copper bars with different potentials due to safety requirements, resulting in the following disadvantages of the isolated power converter according to the conventional technology.

1) Due to the large gap between the bare copper bars, a width of each single bare copper bar is reduced under the same boundary conditions, resulting in reduction in flow capacity of the bare copper bar. Consequently, the bare copper bar through which a large current flows heats up severely, thereby reducing product reliability.

2) Due to the skin effect of a high-frequency current outputted from the high-frequency transformer, an effective current-carrying area of the bare copper bar is greatly reduced. Consequently, the bare copper bar through which a large current flows heats up severely, thereby reducing the product reliability.

3) The high-frequency current may result in a high-frequency alternating magnetic field which further results in an induced eddy current in metal around the gap. Consequently, the metal around the gap overheats or even melts, thereby reducing the product reliability. In addition, the metal around the gap heats up to cause eddy current loss, thereby reducing conversion efficiency of the isolated power converter.

SUMMARY

In view of the above, an isolated power converter and a hydrogen production system are provided according to the present disclosure, so as to improve the product reliability and the conversion efficiency of the isolated power converter.

An isolated power converter is provided according to an embodiment of the present disclosure. A circuit topological structure of the isolated power converter includes a high-frequency transformer, a rectifier circuit, and an output capacitor. The high-frequency transformer includes N secondary windings, each of the N secondary windings is cascaded to an input end of one rectifier circuit and output ends of the N rectifier circuits are connected in parallel to the output capacitor, where N is greater than or equal to 1. An electrical connection structure in the isolated power converter includes N secondary winding output bus bars, N rectifier circuit input bus bars, and a positive-negative bus bar. For each of the N secondary windings, a high-frequency current outputted from the secondary winding is inputted to the rectifier circuit connected to the secondary winding via one of the N secondary winding output bus bars and one of the N rectifier circuit input bus bars that correspond to the secondary winding. In a case that the secondary winding includes M tapping points, the secondary winding output bus bar and the rectifier circuit input bus bar that correspond to the secondary winding each include M copper bars that are insulated and stacked. The M tapping points of the secondary winding overlap the M copper bars of the secondary winding output bus bar at input ends of the M copper bars, respectively. Output ends of the M copper bars of the secondary winding output bus bar overlap input ends of the M copper bars of the rectifier circuit input bus bar, respectively. M is greater than or equal to 2. The positive-negative bus bar includes two copper bars that are insulated and stacked. Multiple electrical connection parts are arranged on each of copper bars of the positive-negative bus bar and the rectifier circuit input bus bars for connecting a rectifier device and the output capacitor.

In an embodiment, a chassis of the isolated power converter includes an upper part and a lower part. The N secondary winding output bus bars and the N rectifier circuit input bus bars are all L-shaped. In the lower part of the chassis, the M tapping points of the secondary winding overlap the M copper bars of the secondary winding output bus bar at the input ends of the M copper bars of the secondary winding output bus bar, respectively. The output ends of the M copper bars of the secondary winding output bus bar extend to the upper part of the chassis and overlap the input ends of the M copper bars of the rectifier circuit input bus bar in one-to-one correspondence. The output ends of the M copper bars of the secondary winding output bus bar, the positive-negative bus bar, the N rectifier circuit input bus bars, the rectifier device and the output capacitor are all arranged in the upper part of the chassis.

In an embodiment, copper bars overlapping each other are connected by a fastener.

In an embodiment, the electrical connection part is a pressure riveting copper column exposed on the copper bar, a copper column welded on the copper bar, or a convex hull formed on the copper bar.

In an embodiment, a double-sided liquid cooling plate is arranged in the chassis. A lower surface of the double-sided liquid cooling plate is attached to the high-frequency transformer. An upper surface of the double-sided liquid cooling plate is attached to the rectifier device and the output capacitor. The rectifier device and the output capacitor are arranged on lower surfaces of the positive-negative bus bar and the N rectifier circuit input bus bars.

In an embodiment, a thermally conductive pad is arranged in the chassis. The thermally conductive pad is arranged between one or more power modules and the double-sided liquid cooling plate. The power module includes at least the rectifier device, the output capacitor, and the high-frequency transformer.

In an embodiment, the rectifier circuit is a full-bridge rectifier circuit or a full-wave rectifier circuit. In a case that the rectifier circuit is the full-bridge rectifier circuit, M is equal to 2. In a case that the rectifier circuit is the full-wave rectifier circuit, M is equal to 3.

In an embodiment, in the case that the rectifier circuit is the full-bridge rectifier circuit, two rectifier devices in a same half-bridge in the rectifier circuit are packaged together as a half-bridge module, and an electrode of the half-bridge module is connected to a corresponding rectifier circuit input bus bar and the positive-negative bus bar.

In an embodiment, in the case that the rectifier circuit is the full-wave rectifier circuit, each of rectifier devices in the rectifier circuit is packaged as a module or every two rectifier devices in the rectifier circuit are packaged together as a module, and electrodes of the module are connected to a corresponding rectifier circuit input bus bar and the positive-negative bus bar.

In an embodiment, the output capacitor includes multiple capacitors. The multiple capacitors are packaged together as a capacitor module or packaged separately, and are connected to the positive-negative bus bar.

In an embodiment, the positive-negative bus bar and the rectifier circuit input bus bars are integrally formed and are arranged in the chassis.

A hydrogen production system is provided according to an embodiment of the present disclosure. The hydrogen production system includes a hydrogen production tank and the isolated power converter according to any one of the above embodiments. The isolated power converter is configured to convert inputted electric energy and supply converted electric energy to the hydrogen production tank. The hydrogen production tank is configured to produce hydrogen and oxygen by electrolyzing water.

It can be seen from the above technical solutions that, there is no gap between the M copper bars of the secondary winding output bus bar and the rectifier circuit input bus bar. Further, bus bars overlap each other without a gap. Therefore, the isolated power converter according to the present disclosure has the following advantages. 1) High-frequency magnetic fields resulted from high-frequency currents can cancel each other, Therefore, metal around the bus bar cannot heat up severely, thereby preventing the metal from overheating and even melting, and reducing eddy current loss. 2) A width of the M copper bars can be greatly increased and a thickness of the M copper bars can be greatly reduced in design. In this way, an effective flow area for high-frequency current is increased while ensuring that the copper bars can fully carry current along a thickness direction of the copper bars, thereby effectively preventing the copper bars from heating up due to the skin effect of the high-frequency current. In summary, according to the embodiments of the present disclosure, product reliability and conversion efficiency of the isolated power converter can be improved.

BRIEF DESCRIPTION OF THE DRAWINGS

In order to more clearly illustrate the technical solutions in the embodiments of the present disclosure or in the conventional technology, the drawings to be used in the description of the embodiments or the conventional technology are briefly described below. Apparently, the drawings in the following description show only some embodiments of the present disclosure, and those skilled in the art can obtain other drawings according to the provided drawings without any creative work.

DETAILED DESCRIPTION OF THE EMBODIMENTS

The technical solutions in the embodiments of the present disclosure are clearly and completely described in the following with reference to the accompanying drawings in the embodiments of the present disclosure. Apparently, the embodiments described herein are only a part rather than all of the embodiments of the present disclosure. Based on the embodiments of the present disclosure, any other embodiments obtained by those skilled in the art without creative efforts fall into the scope of the present disclosure.

An isolated power converter is provided according to an embodiment of the present disclosure. The isolated power converter according to the present disclosure has the same circuit topological structure as the conventional technology. The circuit topological structure includes a high-frequency transformer, a rectifier circuit, and an output capacitor. The high-frequency transformer includes N (greater than or equal to 1) secondary windings. Each of these secondary windings is cascaded to an input end of one rectifier circuit, and output ends of these rectifier circuits are connected in parallel to the output capacitor.

Figure 1:
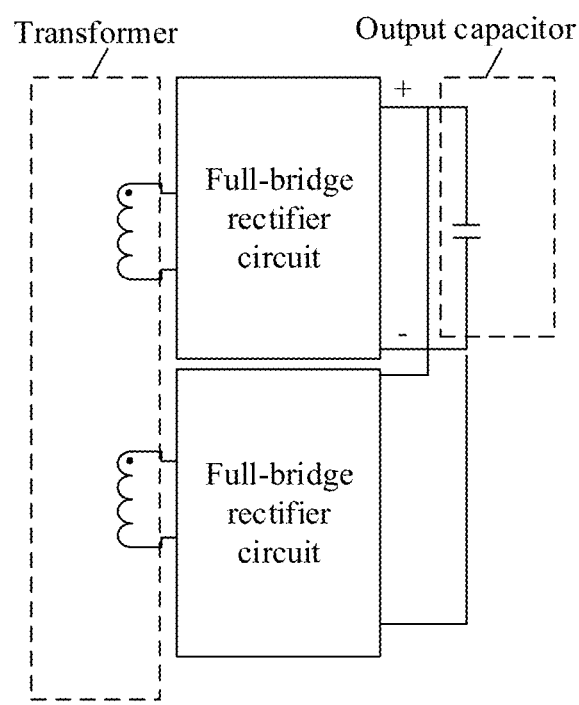
FIG. 1 is a schematic diagram of a circuit structure of an isolated power converter according to the conventional technology.
Figure 2:
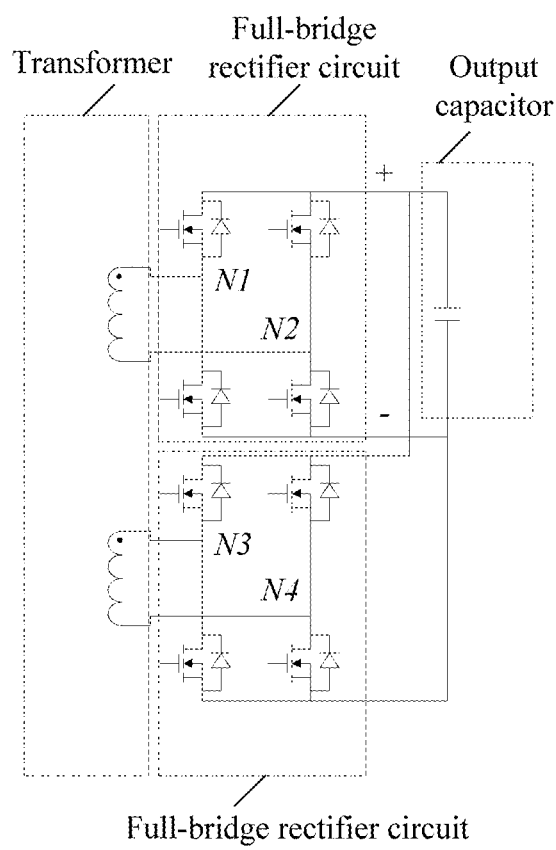
FIG. 2 is a schematic diagram of a circuit structure in a case that a rectifier circuit in the isolated power converter shown in FIG. 1 is a full-bridge rectifier circuit.
Figure 3:
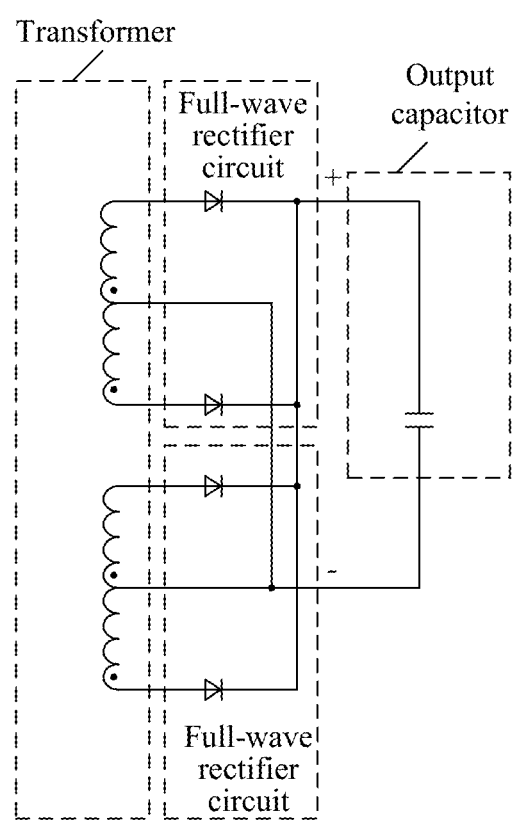
FIG. 3 is a schematic diagram of a circuit structure in a case that the rectifier circuit in the isolated power converter shown in FIG. 1 is a full-wave rectifier circuit.

The rectifier circuit may be a full-bridge rectifier circuit, a full-wave rectifier circuit or the like. A rectifier device in the rectifier circuit may be a metal-oxide-semiconductor field-effect transistor (MOSFET), a diode or the like. FIG. 2 shows an example in which N is equal to 2, the rectifier device is the MOSFET, and the rectifier circuit is the full-bridge rectifier circuit. FIG. 3 shows an example in which N is equal to 2, the rectifier device is the diode, and the rectifier circuit is the full-wave rectifier circuit.

Compared with the conventional technology, an electrical connection structure in the isolated power converter according to the embodiment of the present disclosure is improved as follows.

Figure 4:
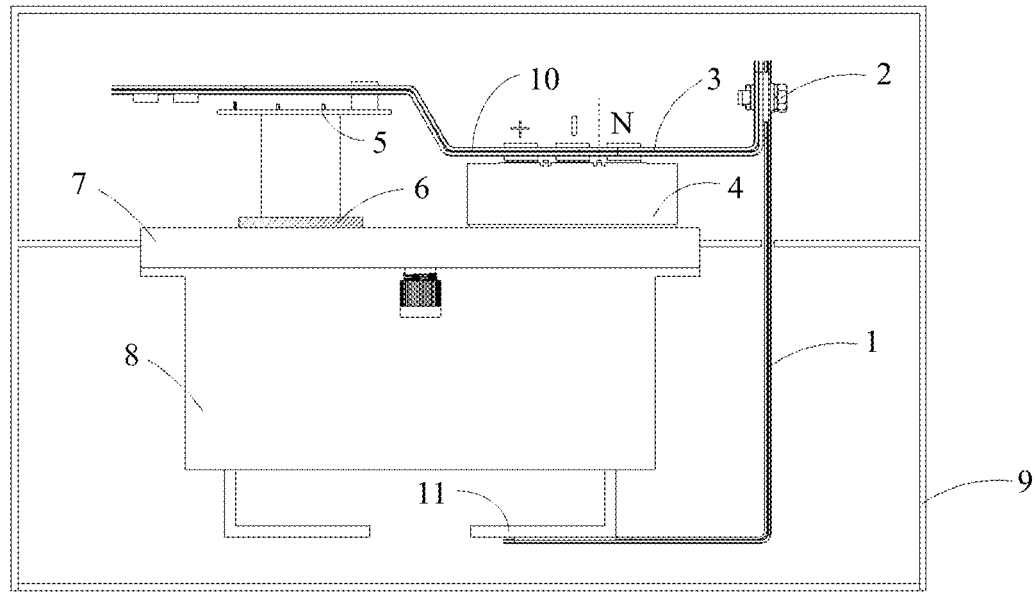
FIG. 4 is a front view of an electrical connection structure in an isolated power converter according to an embodiment of the present disclosure.

Referring to FIG. 4, the electrical connection structure includes N secondary winding output bus bars 1, N rectifier circuit input bus bars 3, and a positive-negative bus bar 10.

High-frequency currents outputted from secondary windings of a high-frequency transformer 8 are inputted to rectifier circuits via secondary winding output bus bars 1 and rectifier circuit input bus bars 3, respectively. In a case that the secondary winding has M tapping points 11 where M is greater than or equal to 2, the secondary winding output bus bar 1 corresponding to the secondary winding includes M copper bars, and the rectifier circuit input bus bar 3 corresponding to the secondary winding includes M copper bars. The positive-negative bus bar 10 includes two copper bars. For any one of the secondary winding output bus bar 1, the rectifier circuit input bus bar 3 and the positive-negative bus bar 10, the copper bars of the same bus bar are insulated (for example, each of copper bars in the same bus bar is coated or hot-pressed with insulating materials). Then, these insulated copper bars are stacked together, where a part of each of the copper bars for overlapping a copper bar of another bus bar is exposed.

The M tapping points 11 of the secondary winding overlap the M copper bars of the secondary winding output bus bar 1 at input ends of the M copper bars of the secondary winding output bus bar 1, respectively. Output ends of the M copper bars of the secondary winding output bus bar 1 overlap input ends of the M copper bars of the rectifier circuit input bus bar 3, respectively. In order to prevent copper bars overlapping each other from being separated, the copper bars overlapping each other are connected by a fastener 2 preferably. The fastener 2 may be, for example, a bolt. FIG. 4 shows a fastener 2 for connecting the secondary winding output bus bar 1 and the rectifier circuit input bus bar 3 overlapping each other.

Multiple electrical connection parts are arranged on each of the copper bars of the positive-negative bus bar 10 and the rectifier circuit input bus bar 3 (for example, parts represented by "+", "−", and "N" in FIG. 4, and the electrical connection part may be a pressure riveting copper column arranged on the copper bar, a copper column welded on the copper bar, or a convex hull formed on the copper bar and is not limited herein). These electrical connection parts are utilized for connecting a rectifier device 4 and an output capacitor 5 in the rectifier circuit, so that the rectifier device 4 is connected to the positive-negative bus bar 10 and the rectifier circuit input bus bar 3, and the output capacitor 5 is connected to the positive-negative bus bar 10.

In an embodiment, still referring to FIG. 4, a chassis 9 of the isolated power converter includes an upper part and a lower part. The N secondary winding output bus bars 1 and the N rectifier circuit input bus bar 3 are all L-shaped. In the lower part of the chassis 9, the M tapping points 11 of the secondary winding overlap the M copper bars of the secondary winding output bus bar 1 at the input ends of the M copper bars of the secondary winding output bus bar 1, respectively. The output ends of the M copper bars of the secondary winding output bus bar 1 extend to the upper part of the chassis 9 and overlap the input ends of the M copper bars of the rectifier circuit input bus bar 3 respectively. The output ends of the M copper bars of the secondary winding output bus bar 1, the positive-negative bus bar 10, the rectifier circuit input bus bar 3, the rectifier device 4 and the output capacitor 5 are all arranged in the upper part of the chassis 9.

The electrical connection structure is described in detail by an example shown in FIG. 2 in which the chassis 9 of the isolated power converter includes an upper part and a lower part, so that those skilled in the art can further understand the electrical connection structure of the isolated power converter according to the embodiments of the present disclosure. Reference is made to FIGS. 4 to 8.

In the isolated power converter shown in FIG. 2, N and M are both equal to 2. The high-frequency transformer 8 includes two secondary windings 8A and 8B. Currents are outputted from two tapping points of each of the two secondary windings via copper bars, for example. In this case, the secondary winding 8A is provided with two output copper bars 801A and 802A, and the secondary winding 8B is provided with two output copper bars 801B and 802B.

The electrical connection structure of the isolated power converter shown in FIG. 2 includes a secondary winding output bus bar 1A, a secondary winding output bus bar 1B, two rectifier circuit input bus bars 3, and a positive-negative bus bar 10. The secondary winding output bus bar 1A, the secondary winding output bus bar 1B, and the two rectifier circuit input bus bars 3 each include two copper bars. The two copper bars of the same bus bar are insulated, and then are stacked together, where a part of each of the two copper bars for overlapping another copper bar is exposed. For example, the secondary winding output bus bar 1A includes two copper bars 101A and 102A. Each of the copper bars 101A and 102A is insulated, and then the copper bars 101A and 102A are stacked together, where a part of each of the copper bars 101A and 102A for overlapping another copper bar is exposed. The secondary winding output bus bar 1B includes two copper bars 101B and 102B. Each of the copper bars 101B and 102B is insulated, and then the copper bars 101B and 102B are stacked together, where a part of each of the copper bars 101A and 102A for overlapping another copper bar is exposed.

The output copper bar 801A of the secondary winding 8A overlaps the copper bar 101A of the secondary winding output bus bar 1A at an input end of the copper bar 101A. The output copper bar 802A of the secondary winding 8A overlaps the copper bar 102A of the secondary winding output bus bar 1A at an input end of the copper bar 102A. The secondary winding output bus bar 1A is L-shaped. The secondary winding output bus bar 1A, after overlapping the secondary winding 8A, extends from the lower part of the chassis 9 to the upper part of the chassis 9, to transmit a high-frequency current outputted from the secondary winding 8A upward. In the upper part of the chassis 9, the two copper bars of the L-shaped secondary winding output bus bar 1A overlap the two copper bars of one L-shaped rectifier circuit input bus bar 3, respectively. The two copper bars of the L-shaped secondary winding output bus bar 1B overlap the two copper bars of the other L-shaped rectifier circuit input bus bars 3, respectively. In an embodiment, any two copper bars overlapping each other are electrically connected by a fastener 2.

In the upper part of the chassis 9, multiple pressure riveting copper columns are arranged on each of copper bars of the positive-negative bus bars 10 and the rectifier circuit input bus bars 3. The number of the multiple pressure riveting copper columns are determined according to actual application scenarios. For example, the output capacitor includes two capacitors connected in parallel. In addition, two MOSFETs in the same half bridge shown in FIG. 2 are packaged together as a half-bridge module. Therefore, there are four half-bridge modules with nodes N1, N2, N3, and N4 as their respective half-bridge midpoints in FIG. 2. In this case, a pressure riveting copper column is arranged on one of the two copper bars of one rectifier circuit input bus bar 3 for connecting the node N1 in FIG. 2, and a pressure riveting copper column is arranged on the other of the two copper bars of the rectifier circuit input bus bar 3 for connecting the node N2 in FIG. 2. Further, a pressure riveting copper column is arranged on one of the two copper bars of the other rectifier circuit input bus bars 3 for connecting the node N3 in FIG. 2, and a pressure riveting copper column is arranged on the other of the two copper bars of the other rectifier circuit input bus bars 3 for connecting the node N4 in FIG. 2. Six pressure riveting copper columns are arranged on one of the two copper bars of the positive-negative bus bar 10 for connecting positive electrodes of four half-bridge modules and positive electrodes of the two capacitors, and six pressure riveting copper columns are arranged on the other of the two copper bars of the positive-negative bus bar 10 for connecting negative electrodes of the four half-bridge modules and negative electrodes of the two capacitors.

The output capacitor may be one capacitor or may include multiple capacitors. In a case that the output capacitor includes multiple capacitors, the multiple capacitors may be packaged together as a capacitor module or may be packaged separately, and then are connected to the positive-negative bus bar 10. FIG. 4 to FIG. 8 only show an example in which the output capacitor includes two capacitors connected in parallel and the two capacitors are packaged separately and then are connected to the positive-negative bus bar 10. The number of capacitors that are packaged to form an output capacitor is not limited, as long as a bus bar can be connected to electrodes of the output capacitor according to the circuit topological structure. FIG. 4 to FIG. 8 only show an example in which the two rectifier devices in the same half-bridge in the rectifier circuit are packaged together as a half-bridge module, and then an electrode of the half-bridge module is connected to the positive-negative bus bar 10 and a corresponding rectifier circuit input bus bar 3.

Based on the above electrical connection structure, the high-frequency currents outputted from the secondary windings of the high-frequency transformer 8 are inputted to the rectifier circuits via the secondary winding output bus bars 1 and the rectifier circuit input bus bars 3, respectively. Then, rectified currents outputted from the rectifier circuits that are connected in parallel are inputted to the output capacitor, so that high-frequency components in the rectified currents are filtered out. Therefore, a direct current with few high frequency components is outputted from output ends 301 and 302 of the two copper bars of the positive-negative bus bar 10.

In the isolated power converter shown in FIG. 3, N is equal to 2, and M is equal to 3. An electrical connection structure in the isolated power converter shown in FIG. 3 is similar to the electrical connection structure in the isolated power converter shown in FIG. 2, and is not described in detail here. In a case that the rectifier circuit is the full-wave rectifier circuit, rectifier devices in the rectifier circuit may be packaged separately as a module or every two rectifier devices in the rectifier circuit may be packaged together as a module. Then, electrodes of the modules are connected to the positive-negative bus bar 10 and the rectifier circuit input bus bars 3, respectively.

In the above embodiments, the positive-negative bus bar 10 and the rectifier circuit input bus bar 3 may be separately formed and then are arranged in the chassis 9. However, considering that the positive-negative bus bar 10 and the rectifier circuit input bus bar 3 are to be utilized together for arranging devices, the positive-negative bus bar 10 and the rectifier circuit input bus bar 3 may be integrally formed and then are arranged in the chassis 9.

It can be seen from the embodiments of the present disclosure that, there is no gap between the M copper bars of the secondary winding output bus bar and the rectifier circuit input bus bar. Further, bus bars overlap each other without a gap. Therefore, the isolated power converter according to the present disclosure has the following advantages.

1) Since M copper bars of a laminated bus bar are stacked together, when high-frequency currents outputted from the same secondary winding of the high-frequency transformer flow the M copper bars, high-frequency magnetic fields induced in the M copper bars have the same magnitude and opposite directions. These high-frequency magnetic fields with the same magnitude and opposite directions can cancel each other, leading to no high-frequency magnetic field radiation around the laminated bus bar. Therefore, metal around the laminated bus bar cannot heat up severely, thereby preventing the metal from overheating and even melting, and reducing eddy current loss.

2) Since the M copper bars are stacked without a gap, a width of the M copper bars can be greatly increased and a thickness of the M copper bars can be greatly reduced in design (for example, the thickness of the M copper bars is reduced to two times a skin depth of the high-frequency current). In this way, flow capacity of a single copper bar under the same boundary conditions can be increased. Further, an effective flow area for high-frequency current is increased while ensuring that the copper bars can fully carry current along a thickness direction of the copper bars, thereby effectively preventing the copper bars from heating up due to the skin effect of the high-frequency current.

3) The multiple copper bars are stacked without a gap, and the laminated bus bars are each bent and overlap each other, thereby effectively reducing a volume of the isolated power converter.

4) The chassis 9 including upper and lower parts leads to a compact isolated power converter, which is beneficial to shorten a circuit loop for the high-frequency current. Correspondingly, electromagnetic interference resulted from the high-frequency current is reduced, thereby improving reliability of controlling a circuit.

In summary, the isolated power converter according to the embodiments of the present disclosure has a small volume and high reliability. Further, conversion efficiency of the isolated power converter is improved, and the reliability of controlling a circuit is improved, thereby improving product competitiveness.

Figure 5:
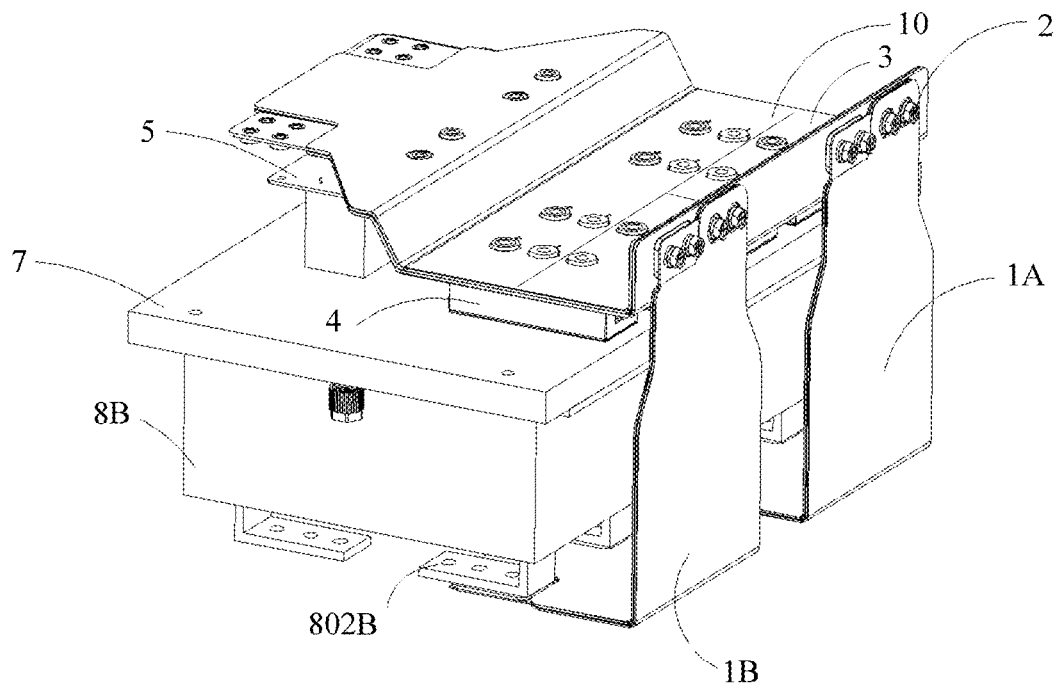
FIG. 5 is a three-dimensional schematic diagram of an electrical connection structure in an isolated power converter according to an embodiment of the present disclosure.
Figure 6:
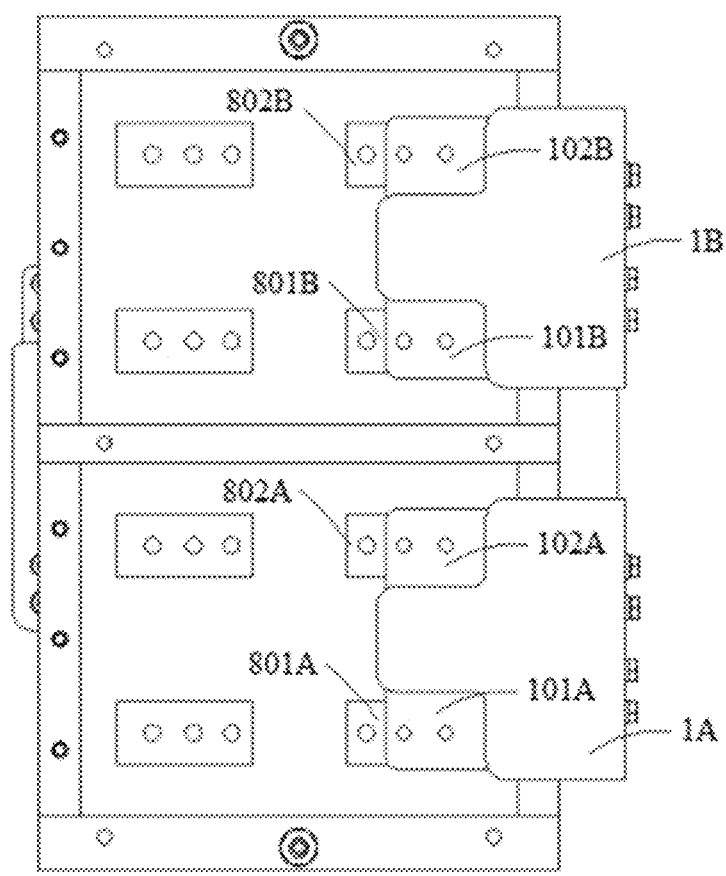
FIG. 6 is a bottom view of an electrical connection structure in an isolated power converter according to an embodiment of the present disclosure.
Figure 7:
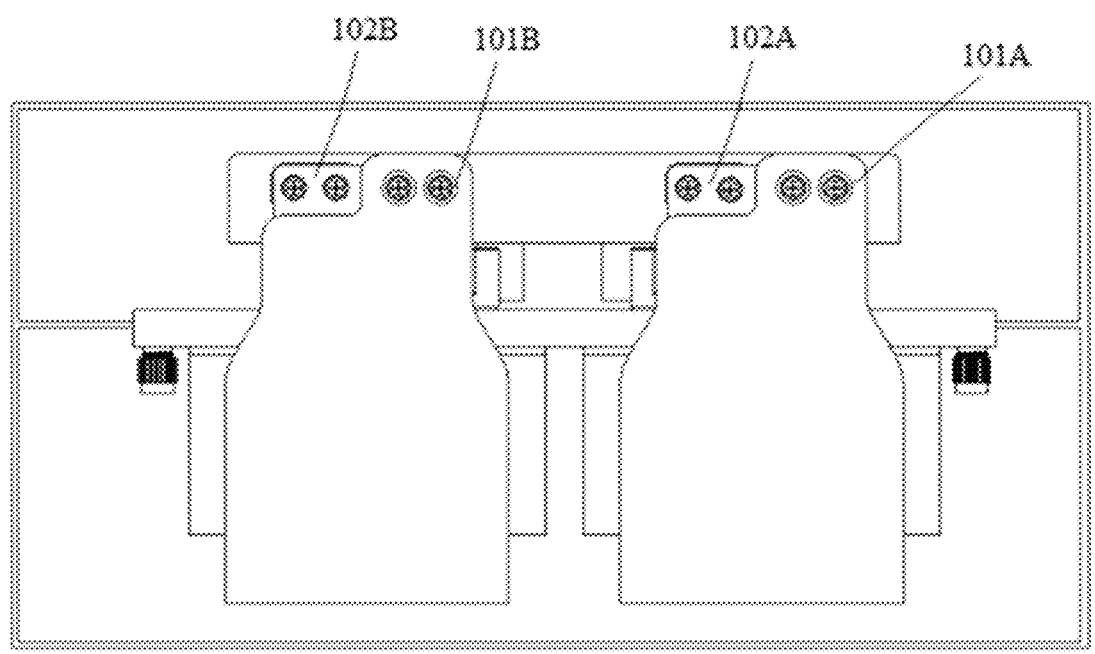
FIG. 7 is a right side view of an electrical connection structure in an isolated power converter according to an embodiment of the present disclosure.
Figure 8:
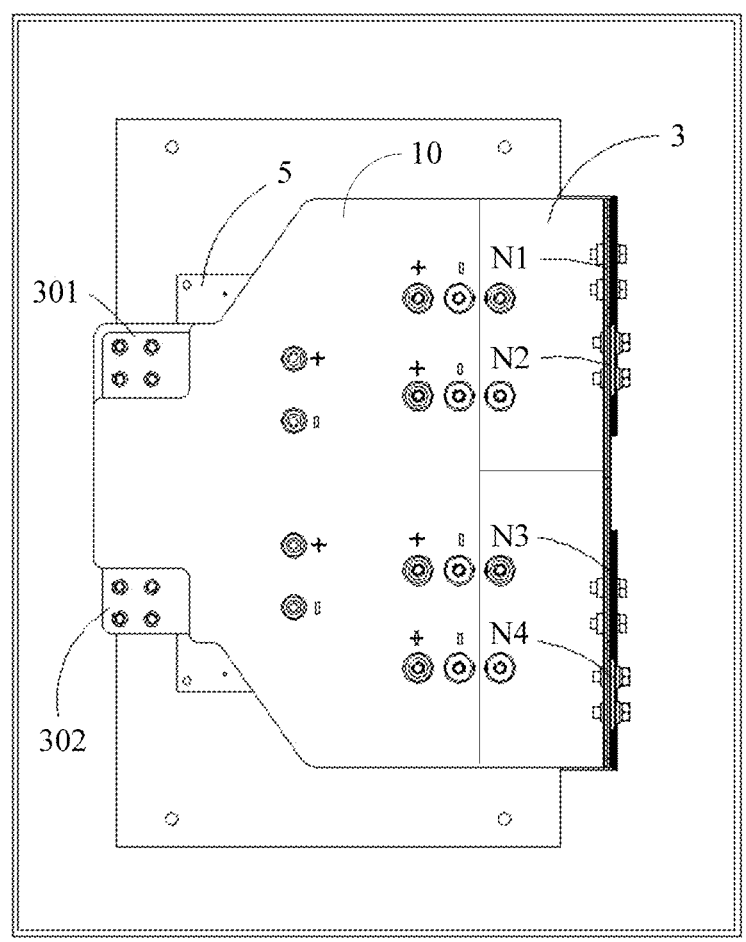
FIG. 8 is a top view of an electrical connection structure in an isolated power converter according to an embodiment of the present disclosure.

In an embodiment of the present disclosure, still referring to FIG. 4 or FIG. 5, a double-sided liquid cooling plate 7 is arranged in the chassis 9. A lower surface of the double-sided liquid cooling plate 7 is attached to the high-frequency transformer. An upper surface of the double-sided liquid cooling plate 7 is attached to the rectifier devices and the output capacitor. The rectifier devices and the output capacitor are arranged on lower surfaces of the positive-negative bus bar 10 and the N rectifier circuit input bus bars 3.

In the embodiment of the present disclosure, based on the electrical connection structure, utilization of liquid cooling plates is increased and the number of liquid cooling plates is reduced by arranging the double-sided liquid cooling plate 7, thereby reducing the volume of the isolated power converter and product cost, and further improving the product competitiveness.

In an embodiment of the present disclosure, still referring to FIG. 4, a thermally conductive pad 6 is arranged in the chassis 9. The thermally conductive pad 6 is arranged between one or more power modules and the double-sided liquid cooling plate. The power module includes at least the rectifier device, the output capacitor, and the high-frequency transformer. The thermally conductive pad 6 is configured to quickly transfer heat generated by the power modules to the double-sided liquid cooling plate 7 for heat dissipation.

A hydrogen production system is further provided according to an embodiment of the present disclosure. The hydrogen production system includes a hydrogen production tank and the isolated power converter disclosed above. The isolated power converter is configured to convert inputted electric energy and then supply the converted electric energy to the hydrogen production tank. The hydrogen production tank is configured to produce hydrogen and oxygen by electrolyzing water. Hydrogen energy is green and efficient secondary energy and has a wide range of sources, and is increasingly important in the field of new energy.

Embodiments of the present disclosure are described in a progressive manner, each of the embodiments emphasizes differences from other embodiments, and the same or similar parts among the embodiments may be referred to each other.

According to the above description of the disclosed embodiments, those skilled in the art can implement or practice the present disclosure. Various modifications to the embodiments are apparent for the skilled in the art. General principles defined herein may be implemented in other embodiments without departing from the scope of the present disclosure. Therefore, the present disclosure is not limited to the embodiments disclosed herein, but is to conform to the widest scope in accordance with the principles and novel features disclosed herein.

The invention claimed is:

1. An isolated power converter, wherein a circuit topological structure of the isolated power converter comprises a high-frequency transformer, a rectifier circuit and an output capacitor, wherein the high-frequency transformer comprises N secondary windings, each of the N secondary windings is cascaded to an input end of one rectifier circuit and output ends of the N rectifier circuits are connected in parallel to the output capacitor, and N is greater than or equal to 1, wherein
an electrical connection structure in the isolated power converter comprises N secondary winding output bus bars, N rectifier circuit input bus bars, and a positive-negative bus bar;
for each of the N secondary windings:
a high-frequency current outputted from the secondary winding is inputted to the rectifier circuit connected to the secondary winding via one of the N secondary winding output bus bars and one of the N rectifier circuit input bus bars that correspond to the secondary winding;
in a case that the secondary winding comprises M tapping points, the secondary winding output bus bar and the rectifier circuit input bus bar that correspond to the secondary winding each comprise M copper bars that are insulated and stacked, the M tapping points of the secondary winding overlap the M copper bars of the secondary winding output bus bar at input ends of the M copper bars of the secondary winding output bus bar, respectively; output ends of the M copper bars of the secondary winding output bus bar overlap input ends of the M copper bars of the rectifier circuit input bus bar, respectively, wherein M is greater than or equal to 2;
the positive-negative bus bar comprises two copper bars that are insulated and stacked; and
a plurality of electrical connection parts are arranged on each of copper bars of the positive-negative bus bar and the rectifier circuit input bus bars for connecting a rectifier device and the output capacitor.

2. The isolated power converter according to claim 1, wherein
a chassis of the isolated power converter comprises an upper part and a lower part;
the N secondary winding output bus bars and the N rectifier circuit input bus bars are all L-shaped;
in the lower part of the chassis, the M tapping points of the secondary winding overlap the M copper bars of the secondary winding output bus bar at the input ends of the M copper bars of the secondary winding output bus bar, respectively;
the output ends of the M copper bars of the secondary winding output bus bar extend to the upper part of the chassis and overlap the input ends of the M copper bars of the rectifier circuit input bus bar respectively; and
the output ends of the M copper bars of the secondary winding output bus bar, the positive-negative bus bar, the N rectifier circuit input bus bars, the rectifier device and the output capacitor are all arranged in the upper part of the chassis.

3. The isolated power converter according to claim 1, wherein copper bars overlapping each other are connected by a fastener.

4. The isolated power converter according to claim 1, wherein the electrical connection part is a pressure riveting copper column arranged on the copper bar, a copper column welded on the copper bar, or a convex hull formed on the copper bar.

5. The isolated power converter according to claim 1, wherein a double-sided liquid cooling plate is arranged in the chassis, wherein
a lower surface of the double-sided liquid cooling plate is attached to the high-frequency transformer, an upper surface of the double-sided liquid cooling plate is attached to the rectifier device and the output capacitor, and the rectifier device and the output capacitor are arranged on lower surfaces of the positive-negative bus bar and the N rectifier circuit input bus bars.

6. The isolated power converter according to claim 5, wherein a thermally conductive pad is arranged in the chassis, the thermally conductive pad is arranged between one or more power modules and the double-sided liquid cooling plate, wherein the power module comprises at least the rectifier device, the output capacitor, and the high-frequency transformer.

7. The isolated power converter according to claim 1, wherein the rectifier circuit is a full-bridge rectifier circuit or a full-wave rectifier circuit, wherein
M is equal to 2 in a case that the rectifier circuit is the full-bridge rectifier circuit; and
M is equal to 3 in a case that the rectifier circuit is the full-wave rectifier circuit.

8. The isolated power converter according to claim 7, wherein in the case that the rectifier circuit is the full-bridge rectifier circuit, two rectifier devices in a same half-bridge in the rectifier circuit are packaged together as a half-bridge module, and an electrode of the half-bridge module is connected to a corresponding rectifier circuit input bus bar and the positive-negative bus bar.

9. The isolated power converter according to claim 7, wherein in the case that the rectifier circuit is the full-wave rectifier circuit, each of rectifier devices in the rectifier circuit is packaged as a module or every two rectifier devices in the rectifier circuit are packaged together as a module, and electrodes of the module are connected to a corresponding rectifier circuit input bus bar and the positive-negative bus bar.

10. The isolated power converter according to claim 1, wherein the output capacitor comprises a plurality of capacitors, the plurality of capacitors are packaged together as a capacitor module or packaged separately, and are connected to the positive-negative bus bar.

11. The isolated power converter according to claim 1, wherein the positive-negative bus bar and the rectifier circuit input bus bars are integrally formed and are arranged in the chassis.

12. A hydrogen production system, comprising: a hydrogen production tank and the isolated power converter according to claim 1, wherein the isolated power converter is configured to convert inputted electric energy and supply converted electric energy to the hydrogen production tank; and the hydrogen production tank is configured to produce hydrogen and oxygen by electrolyzing water.

\* \* \* \* \*